United States Patent
Otremba et al.

(10) Patent No.: US 9,952,273 B2
(45) Date of Patent: Apr. 24, 2018

(54) COMPOUND SEMICONDUCTOR DEVICE INCLUDING A SENSING LEAD

(71) Applicant: Infineon Technologies Austria AG, Villach (AT)

(72) Inventors: Ralf Otremba, Kaufbeuren (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/084,030

(22) Filed: Mar. 29, 2016

(65) Prior Publication Data

US 2016/0293549 A1 Oct. 6, 2016

(30) Foreign Application Priority Data

Mar. 31, 2015 (DE) .................. 10 2015 104 990

(51) Int. Cl.
*G01R 31/26* (2014.01)
*H01L 23/495* (2006.01)
*H01L 23/31* (2006.01)

(52) U.S. Cl.
CPC .... *G01R 31/2621* (2013.01); *H01L 23/49541* (2013.01); *H01L 23/49548* (2013.01); *H01L 23/3107* (2013.01); *H01L 23/49568* (2013.01); *H01L 2224/0603* (2013.01); *H01L 2224/48247* (2013.01); *H01L 2224/48257* (2013.01); *H01L 2224/49111* (2013.01); *H01L 2924/181* (2013.01)

(58) Field of Classification Search
CPC ..... H01L 23/538; H01L 23/31; H01L 23/495; H01L 29/20; H01L 29/778; G01R 31/26
See application file for complete search history.

(56) References Cited

U.S. PATENT DOCUMENTS

| | | | | |
|---|---|---|---|---|
| 5,170,312 A | * | 12/1992 | Davies | H01L 24/49 327/565 |
| 2005/0269674 A1 | | 12/2005 | Kawakita et al. | |
| 2009/0212284 A1 | * | 8/2009 | Otremba | H01L 23/4952 257/48 |
| 2013/0235636 A1 | * | 9/2013 | Kadoguchi | H01L 23/49562 363/131 |
| 2014/0097498 A1 | * | 4/2014 | Fernando | H01L 23/49513 257/368 |

FOREIGN PATENT DOCUMENTS

| | | |
|---|---|---|
| CN | 102473700 A | 5/2012 |
| CN | 104037151 A | 9/2014 |
| JP | 2009278134 A | 11/2009 |

* cited by examiner

*Primary Examiner* — Asok K Sarkar
*Assistant Examiner* — Dmitriy Yemelyanov
(74) *Attorney, Agent, or Firm* — Murphy, Bilak & Homiller, PLLC (57) ABSTRACT

A device includes a compound semiconductor chip having a control electrode, a first load electrode and a second load electrode. A first lead is electrically coupled to the control electrode, a second lead is electrically coupled to the first load electrode, and a third lead is electrically coupled to the first load electrode. The third lead is configured to provide a sensing signal from the first load electrode, the sensing signal being based on a physical parameter of the compound semiconductor chip. The control electrode is configured to receive a control signal based on the sensing signal. A fourth lead is electrically coupled to the second load electrode.

19 Claims, 5 Drawing Sheets

COMPOUND SEMICONDUCTOR DEVICE INCLUDING A SENSING LEAD

TECHNICAL FIELD

The disclosure relates, in general, to semiconductor devices. More particular, the disclosure relates to devices including a compound semiconductor material and a lead configured to provide a sensing signal.

BACKGROUND

Semiconductor devices may include multiple electronic components of different type. A control between these components may be disturbed by unwanted parasitic effects, such as e.g. unintentionally induced voltages. In addition, physical parameters of the semiconductor devices and their components may change during operation. Semiconductor devices constantly have to be improved. In particular, it may be desirable to reduce the unwanted effects during an operation of the semiconductor devices. In addition, it may be particularly desirable to monitor and control physical parameters of the semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value that may particularly depend on tolerances that may typically occur when applying techniques for fabricating a housing made of the encapsulation material.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips that may be of different types and may be manufactured by different technologies. In general, the semiconductor chips may include integrated electrical, electrooptical or electromechanical circuits, passives, etc. In addition, the integrated circuits may generally be designed as logic integrated circuits, analog integrated circuits, mixed signal integrated circuits, power integrated circuits, memory circuits, integrated passives, microelectromechanical systems, etc.

The semiconductor chips need not be manufactured from a specific semiconductor material and may contain inorganic and/or organic materials that are not semiconductors, such as, for example, insulators, plastics, metals, etc. In one example, the semiconductor chips may be made of or may include an elemental semiconductor material, for example Si, etc. In a further example, the semiconductor chips may be made of or may include a compound semiconductor material, for example GaN, SiC, SiGe, GaAs, etc. In particular, the devices described herein may include one or more compound semiconductor chips based on a compound semiconductor material.

The semiconductor chips may include one or more power semiconductors. In general, the power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc. In particular, the power semiconductor chips may be based on one or more of the compound semiconductor materials specified above. Devices in accordance with the disclosure are not restricted to include a specific type of power semiconductor chip. Comments made in connection with a specific type of power semiconductor chip may thus be likewise applied to other types of power semiconductor chips. As such, for example, the terms "power MOSFET", "power HEMT", "MOSFET", "HEMT" may be used synonymously herein.

The semiconductor chips may have a vertical structure, i.e. the semiconductor chips may be fabricated such that electrical currents may substantially flow in a direction perpendicular to the main faces of the semiconductor chips. A semiconductor chip having a vertical structure may have electrodes over its two main faces, i.e. over its top side and bottom side. In particular, power semiconductor chips may have a vertical structure and may have electrodes arranged over both main faces. In one example, the source electrode and gate electrode of a power MOSFET may be arranged over one face while the drain electrode of the power MOSFET may be arranged over the other face. In this regard, each of the drain electrode and the source electrode may represent an example of a load electrode, while the gate electrode may represent an example of a control electrode. In general, a load electrode may particularly correspond to a large area electrode which may even cover the majority of a face of a semiconductor device while a control electrode may have a smaller area than a load electrode. For example, a gate electrode may be controlled by a control circuit or a control semiconductor chip. In a further example, a power HEMT may be configured as a vertical power semiconductor chip. Yet further examples for vertical power semiconductor chips are a PMOS (P-Channel Metal Oxide semiconductor), an NMOS (N-Channel Metal Oxide semiconductor), or one of the exemplary power semiconductors specified above.

The semiconductor chips may have a lateral structure, i.e. the semiconductor chips may be fabricated such that electrical currents may substantially flow in a direction parallel to a main face of the semiconductor chips. A semiconductor chip having a lateral structure may have electrodes arranged over one of its main faces. In one example, a semiconductor chip having a lateral structure may include an integrated circuit, such as e.g. a logic chip. In a further example, a power semiconductor chip may have a lateral structure, wherein the electrodes may be arranged over one main face of the chip. For example, the gate electrode, the source electrode and the drain electrode of a power MOSFET may be arranged over one main face of the power MOSFET. A further example of a lateral power semiconductor chip may be a power HEMT that may be fabricated from one of the above mentioned compound semiconductor materials.

The devices described herein may include one or more control semiconductor chips (or control integrated circuits) configured to control and/or drive electronic components of the device. For example, a control semiconductor chip may be configured to control and/or drive the integrated circuits of one or more power semiconductor chip. In this regard, the terms "control semiconductor chip" and "driver semiconductor chip" may be used synonymously herein.

A driver circuit may be configured to drive one or more electronic components of the device, such as e.g. a high-power transistor. The driven components may be voltage driven or current driven. For example, Power MOSFETs, IGBTs, etc., may be voltage driven switches, since their insulated gate may particularly behave like a capacitor. Conversely, switches such as triacs (triode for alternating current), thyristors, bipolar transistors, a PN diode, etc., may be current driven. In one example, driving a component including a gate electrode may be performed by a gate driver circuit. The driving process may include applying different voltages to the gate electrode, for example in form of turn-on and turn-off switching wave forms. In a further example, a driver circuit may be used to drive a direct driven circuit. A control circuit may be configured to control one or more drivers that drive components of the device. In one example, a control circuit may simultaneously control drivers of multiple direct driven circuits. For example, a half bridge circuit including two direct driven circuits may thus be controlled by a controller. A controller may e.g. include a micro controller.

The semiconductor chips may include an arbitrary number of electrical contacts. In one example, the electrical contacts may be arranged over the frontside and the backside of the semiconductor chip. Such semiconductor chip may e.g. correspond to a power semiconductor chip that may include a drain contact arranged on one side of the semiconductor chip, as well as a source contact and a gate contact arranged over the opposite side of the semiconductor chip. In a further example, the electrical contacts may be exclusively arranged over the frontside of the semiconductor chip. For example, such semiconductor chip may be a lateral chip and may e.g. correspond to a lateral power HEMT. An electrical contact may have the form of a contact pad (or a contact element or a contact terminal or a contact electrode) that may be fabricated of at least one of a metal and a metal alloy. Any desired metal or metal alloy, for example, aluminum, titanium, gold, silver, copper, palladium, platinum, nickel, chromium, vanadium, tungsten, molybdenum, etc., may be used as a material.

The semiconductor chips may be packaged or unpackaged. In this regard, the terms "semiconductor device" and "semiconductor package" as used herein may be interchangeably used. In particular, a semiconductor package may be a semiconductor device including an encapsulation material that may at least partly cover (or embed or encapsulate) one or more components of the semiconductor device. In one example, multiple components of a device may be covered by the same encapsulation material, thereby forming a case or housing such that the components may be regarded as a part of the same package. In a further example, a first set of components may be covered by a first encapsulation material while a second set of components may be covered by a second encapsulation material, wherein the first and second encapsulation material may be similar or may differ from each other. When the first and second encapsulation materials are (spatially) separated from each other, the components of the first set and the second set may be regarded as parts of different packages.

The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the device with the encapsulation material, for example at least one of compression molding, injection molding, powder molding, liquid molding, lamination, etc.

The devices described herein may include a carrier over which one or more components of the device may be arranged. In general, a carrier may be manufactured from at least one of a metal, an alloy, a dielectric, a plastic, a ceramic, etc. The carrier may have a homogeneous structure, but may also provide internal structures like conducting paths with an electrical redistribution function. For example, a carrier may include at least one of a diepad, a leadframe including a diepad, a ceramic substrate including one or more redistribution layers, etc.

A carrier may include one or more carrier sections having various purposes. In one example, a carrier section may provide a mounting surface for mounting an electronic component of the device. In this regard, the carrier section may e.g. correspond to a diepad on which a semiconductor chip may be mounted. A level of the device including such carrier section may be referred to as diepad level. In a further example, a carrier section may include one or more electrically conductive terminals (or leads or pins) that may provide an electrical connection between components of the device and external components. In this regard, the carrier section may e.g. correspond to one or more leads of a leadframe. The leads may protrude out of an encapsulation material of a semiconductor package and provide an electrical connection to internal components of the semiconductor package. An electrical connection between a lead and a semiconductor chip of the device may be additionally established by an electrically conductive coupling element, for example at least one of a wire and a clip. A level of the device including such carrier section may be referred to as wirebond level.

The carrier sections of a carrier may be arranged on one or more levels that may differ from each other. A carrier having multiple carrier sections arranged on different levels may be referred to as multilevel carrier. In one example, each carrier section of a carrier may be arranged in a plane, wherein the different planes associated with the different carrier sections may be arranged in parallel to each other. For example, diepads of the device may be arranged at the diepad level, and electrical terminals or leads coupled to wirebonds may be arranged at the wirebond level. In a multilevel carrier, a distance between a first level and a different second level may lie in a range from about 0.5 millimeter to about 5.0 millimeter, and more particular in any of the subranges included in this range.

The carrier sections of a carrier may at least partly be covered by an encapsulation material of the device. A carrier section may be completely surrounded by an encapsulation material such that there are no surfaces of the carrier section accessible from outside of the encapsulation material. A further carrier section may be at least partly exposed from an encapsulation material such that there may be one or more exposed surfaces. For example, a surface of a diepad may be exposed from an encapsulation material such that a heatsink may be arranged over the exposed surface. Thermal grease may be arranged between the exposed surface of the diepad and the heatsink. During an operation of a corresponding device, heat generated by e.g. a semiconductor chip may be dissipated along a path that may extend from the semiconductor chip to the heatsink. In one example, the diepad may include a hole extending through the diepad, wherein the hole may be exposed from the encapsulation material or not. The heatsink may be attached to the diepad by a fixing component, such as e.g. a screw, that may extend through the hole.

In one example, a carrier may include a leadframe that may be of any shape, any size and any material. The leadframe may be structured such that diepads and leads may be formed. During a fabrication of a device, the diepads and the leads may be connected to each other. The diepads and the leads may also be made from one piece. The diepads and the leads may be connected among each other by connection means with the purpose of separating some of the diepads and the leads in the course of the fabrication. Here, separating the diepads and the leads may be carried out by at least one of mechanical sawing, a laser beam, cutting, stamping, milling, etching, etc. In one example, the leadframe may be a multilevel leadframe having various sections arranged on different levels. For example, the different levels of the leadframe may be implemented by bending the leadframe in a suitable manner before or after the various carrier sections may have been formed.

In particular, a leadframe may be electrically conductive. For example, the leadframe may be entirely fabricated from metals and/or metal alloys, in particular at least one of copper, copper alloys, nickel, iron nickel, aluminum, aluminum alloys, steel, stainless steel, etc. The leadframe material may include traces of iron, sulfur, iron nitride, etc. The leadframe may be plated with an electrically conductive material, for example at least one of copper, silver, palladium, gold, nickel, iron nickel, nickel phosphorus, etc. In this case, the leadframe may be referred to as "pre-plated leadframe". Even though a leadframe may be electrically conductive, an arbitrary selection of diepads of the leadframe may be electrically insulated from each other.

The devices described herein may include one or more leads that may be a part of a leadframe in one example. The leads may protrude out of an encapsulation material of the device such that an electrical connection between internal components of the device and external components may be established. In one example, the leads may protrude out of a specific surface of the encapsulation material, wherein the individual leads may be particularly arranged in parallel. The distances between the individual leads may be similar or may differ from each other. In this regard, a distance between two leads may be referred to as lead pitch. In one example, a lead pitch $p_{low}$ between two leads used for low voltage or logic applications may lie in a range from about 1 millimeter to about 3 millimeter, and a lead pitch $p_{high}$ between two leads used for high voltage/high current applications may be about $2 \times p_{low}$.

The devices described herein may include one or more leads that may provide one or more sensing signals. Such sensing signal may be based on or may depend on a physical parameter (or physical quantity or physical magnitude) of an electronic component included in the considered device, for example an included compound semiconductor chip. The sensing signal may thus represent or may include information about a physical property of the electronic component that can be quantified by a measurement. In this regard, a sensing signal provided by the lead and the associated physical parameter may not necessarily coincide with regard to their physical units. For example, the sensing signal may correspond to a measured voltage, but may represent a different physical quantity, for example an electrical current or a temperature.

In one example, a sensing lead may provide a sensing signal that may be based on or may represent an electrical potential in or on a semiconductor chip or one of its components. The sensing signal may e.g. represent an electrical potential of an electrode of the semiconductor chip, for example a source electrode of a power HEMT. In this regard, the lead providing the sensing signal may optionally be electrically coupled to a voltage measuring unit configured to measure the electrical potential of the considered electrode.

In a further example, a sensing lead may provide a sensing signal that may be based on an electrical current in or on a semiconductor chip. The sensing signal may e.g. be based on a current passing between a source electrode of a power transistor and a drain electrode of the power transistor. In this regard, the lead providing the sensing signal may be electrically coupled to a shunt, i.e. a low impedance electrical resistor, which may be used for measuring the electrical current. A current flowing through the shunt may cause a voltage drop that may be proportional to the electrical current and which may be measured. In one example, the shunt may be integrated in the considered semiconductor chip. In a further example, the resistance of an external component through which the electrical current passes may be considered and used as a shunt. For example, a wire electrically coupling an electrode of the semiconductor chip and a lead may be considered as a shunt. Here, the electrical potential measured at the electrode of the semiconductor chip may be used to determine a corresponding electrical current.

In yet a further example, a sensing lead may provide a sensing signal that may be based on a temperature in or on a semiconductor chip. In this regard, the lead providing the sensing signal may be electrically coupled to a diode. The conductivity of the diode may depend on its temperature such that a voltage at an exposed end section of the lead electrically connected to the diode may depend on the temperature of the diode as well. The diode may e.g. be integrated in the semiconductor chip. Alternatively, the diode may be arranged external to the semiconductor chip.

A sensing signal provided by a sensing lead may be used to control and monitor the state of an electronic component. For this purpose, the sensing signal may e.g. be provided to a control semiconductor chip that may be configured to generate a control signal and to provide the control signal to relevant components performing the control of the device.

In one example, a sensed electrical potential of a source electrode of a power HEMT may be used to generate a control signal that may be used by a gate driver circuit to control a gate electrode of the power HEMT. In particular, the measured electrical potential $U_S$ at the source electrode may be used to correct a voltage $U_G$ that may have been applied to the gate electrode without taking into account the sensing signal. A corrected value that may be applied to the gate electrode may thus have a value of $U_G-U_S$ in one example.

In a further example, a sensing of an electrical current in the semiconductor chip may be used to monitor a temporal development of the electrical current. This way, it may be avoided that the strength of the current exceeds a threshold value. When the measured electrical current exceeds a predetermined threshold value, an operation of one or more components of the device may be adjusted in a suitable manner in order to force the current strength below the threshold value.

In yet a further example, a measurement of a temperature in the semiconductor chip may be used to monitor a temporal development of the temperature. It may then be possible to avoid that the temperature exceeds a threshold value. When the measured temperature exceeds a predetermined threshold value, an operation of one or more components of the device may be adjusted (or delayed or stopped) such that the temperature may fall below the predetermined threshold value.

The devices described herein may include one or more electrically conductive elements configured to provide an electrical coupling between components of the devices. In one example, an electrically conductive element may be configured to electrically connect an electrode of a semiconductor chip and an electrode of another semiconductor chip. In a further example, an electrically conductive element may be configured to electrically connect an electrode of a semiconductor chip to a diepad or a lead of a leadframe.

An electrically conductive element may include one or more contact clips. A contact clip may be made of or may include a material similar to a material of a leadframe. The contact clip may be fabricated by at least one of stamping, punching, pressing, cutting, sawing, milling, etc. A contact between the electrically conductive element and a contact pad of a semiconductor chip may be established by e.g. a diffusion soldering process.

An electrically conductive element may include one or more wires, in particular bond wires or bonding wires. A wire may include a metal and/or a metal alloy, in particular gold, aluminum, copper, or one or more of their alloys. In addition, the wire may or may not include a coating. The wire may have a circular cross section such that the term "thickness" of the wire may refer to the diameter of the bond wire. For example, a thickness of a wire may depend on the strength of the currents flowing through the wire. In a first example, the wire may have a thickness smaller than 75 micrometer, for example a thickness from about 50 micrometer to about 75 micrometer. Such wire may e.g. include or be made of aluminum. The wire may include further materials, for example up to 1% silicon. For example, such wire may provide an electrical connection between a contact element and a gate electrode of a power semiconductor chip and/or between gate electrodes of two different power semiconductor chips. In a second example, the wire may have a thickness from about 125 micrometer to about 500 micrometer. Such wire may provide an electrical connection between a contact element and a source electrode of a power semiconductor chip.

Figure 1:
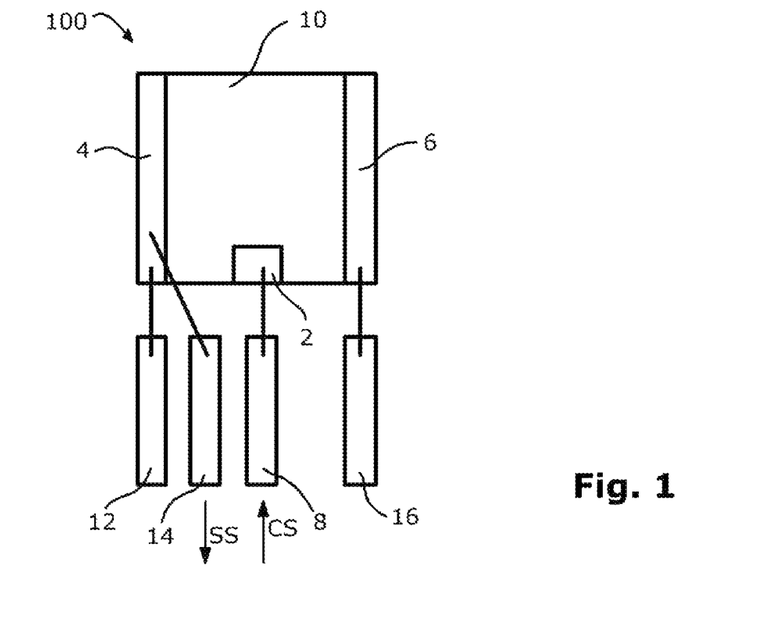
FIG. 1 schematically illustrates a top view of a device 100 in accordance with the disclosure.

FIG. 1 schematically illustrates a top view of a device 100 in accordance with the disclosure. In the example of FIG. 1, the device 100 is illustrated in a general manner and may include further components that are not illustrated for the sake of simplicity. For example, the device 100 may further include one or more components of other devices in accordance with the disclosure.

The device 100 may include a compound semiconductor chip 10 that may include a control electrode 2, a first load electrode 4 and a second load electrode 6. In one example, the compound semiconductor chip 10 may correspond to a power HEMT that may be based on gallium nitride. The control electrode 2 may then correspond to a gate electrode, while the first load electrode 4 and the second load electrode 6 may correspond to a source electrode and a drain electrode, respectively. The device 100 may further include a first lead 8 that may be electrically coupled to the control electrode 2, a second lead 12 that may be electrically coupled to the first load electrode 4, a third lead 14 that may be electrically coupled to the first load electrode 4, and a fourth lead 16 that may be electrically coupled to the second load electrode 6.

The third lead 14 may be configured to provide a sensing signal SS from the first load electrode 4, wherein the sensing signal SS may be based on a physical parameter of the compound semiconductor chip 10. For example, the sensing signal SS may represent at least one of a voltage, an electrical current, a temperature, etc. of the compound semiconductor chip 10. The control electrode 2 may be configured to receive a control signal CS that may be based on the sensing signal SS. For example, the sensing signal SS may be provided by the third lead 14 to a control semiconductor chip (not illustrated) that may be configured to generate and provide the control signal CS to the control electrode 2 via the first lead 8. In the example of FIG. 1, the leads are electrically connected to the electrodes via electrically conductive elements indicated by solid lines. In general, these electrically conductive elements may be arbitrary and may e.g. include at least one of a wire and a clip. However, in further examples, other possibilities for electrically connecting the leads and the electrodes may be chosen.

Figure 2A:
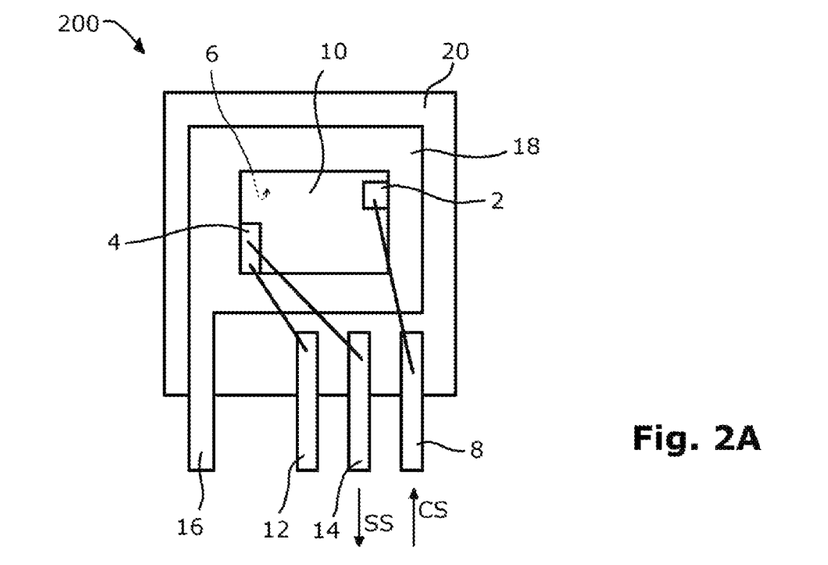
FIG. 2A schematically illustrates a top view of a device 200 in accordance with the disclosure.
Figure 2B:
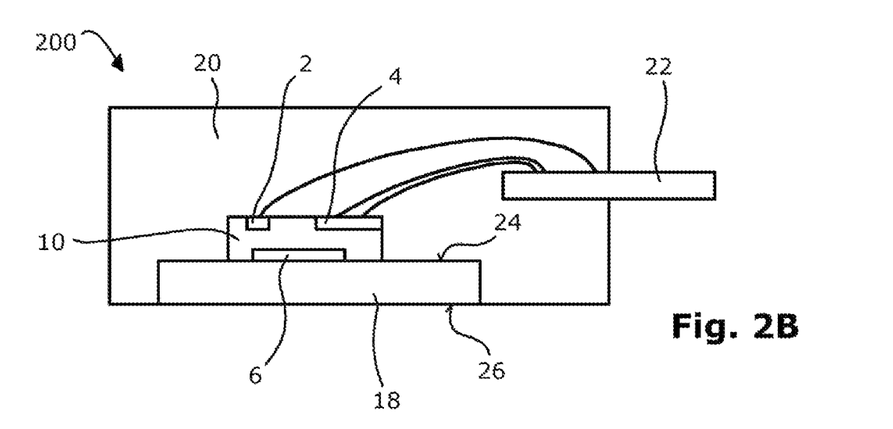
FIG. 2B schematically illustrates a cross-sectional side view of the device 200.

FIGS. 2A and 2B schematically illustrate views of a device 200 in accordance with the disclosure. In particular, FIG. 2A illustrates a top view of the device 200, and FIG. 2B illustrates a cross-sectional side view of the device 200. Due to the chosen perspectives, FIG. 2A may show components that are not shown by FIG. 2B and vice versa. The device 200 may at least partly be similar to the device 100 of FIG. 1. In the example of FIGS. 2A and 2B, the device 200 is illustrated in a general manner and may include further components that are not illustrated for the sake of simplicity. For example, the device 200 may further include one or more components of other devices in accordance with the disclosure.

The device 200 may include a leadframe that may include a diepad 18 and multiple leads 8, 12, 14, 16. In FIG. 2B, not all of the leads 8, 12, 14, 16 may be visible due to the chosen perspective. Here, the multiple leads 8, 12, 14, 16 are denoted by a single reference sign 22. A compound semiconductor chip 10 may be arranged over a first surface 24 of the diepad 18, wherein the compound semiconductor chip 10 may include a gate electrode 2, a source electrode 4 and a drain electrode 6. For example, the compound semiconductor chip 10 may include a power HEMT. In the example of FIGS. 2A and 2B, the power HEMT 10 may be a vertical semiconductor chip. In a further example, the power HEMT may also be of lateral type, wherein the electrodes 2, 4, 6 may then be arranged over a same surface of the power HEMT facing away from the diepad 18. The device 200 may further include an encapsulation material 20 that may cover the compound semiconductor chip 10 and the diepad 18. The encapsulation material 20 may also cover further components of the device 200, for example at least one lead of the plurality of leads 22. A second surface 26 of the diepad 18 opposite the first surface 24 may be exposed from the encapsulation material 20. For example, an optional heatsink (not illustrated) may be arranged over the exposed second surface 26.

A first lead 8 of the leadframe may be electrically coupled to the gate electrode 2, a second lead 12 of the leadframe may be electrically coupled to the source electrode 4, a third lead 14 of the leadframe may be electrically coupled to the source electrode 4, and a fourth lead 16 of the leadframe may be electrically coupled to the drain electrode 6. In the example of FIGS. 2A and 2B, the fourth lead 16 may be electrically connected to the diepad 18. In this connection, the diepad 18 and the fourth lead 16 may e.g. be formed contiguous as a single piece that may be made of an electrically conductive material. In the example of FIGS. 2A and 2B, the leads 8, 12, 14 may be electrically connected to the electrodes 2, 4 via electrically conductive elements indicated by solid lines.

The third lead 14 may be configured to provide a sensing signal SS that may represent an electrical potential of the source electrode 4 to a gate driver circuit (not illustrated). The gate driver may be configured to drive the gate electrode 2 based on the sensing signal SS. In FIG. 2A, an exemplary control signal CS is indicated which may be provided by the gate driver. In one example, the control signal may e.g. represent a corrected value $U_G - U_S$ of the voltage to drive the gate electrode 2. Here, $U_S$ denotes a voltage measured at the source electrode 4, and $U_G$ denotes a voltage that may have been used to drive the gate electrode 2 without taking into account the sensing signal SS.

Figure 3:
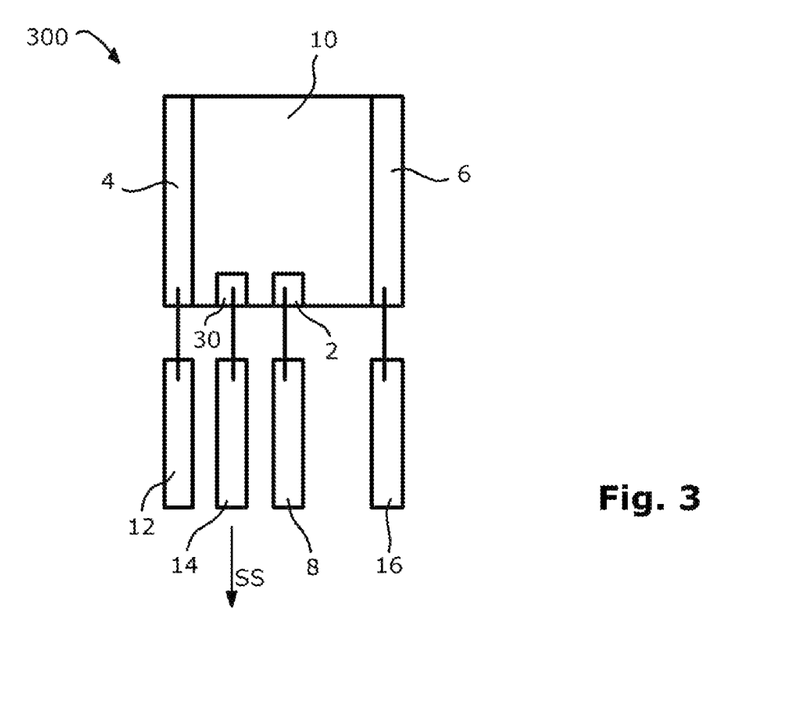
FIG. 3 schematically illustrates a top view of a device 300 in accordance with the disclosure.

FIG. 3 schematically illustrates a top view of a device 300 in accordance with the disclosure. The device 300 may at least partly be similar to the devices 100 and 200 of FIGS. 1 and 2. In the example of FIG. 3, the device 300 is illustrated in a general manner and may include further components that are not illustrated for the sake of simplicity. For example, the device 300 may further include one or more components of other devices in accordance with the disclosure.

The device 300 may include a compound semiconductor chip 10 that may include a control electrode 2, a first load electrode 4 and a second load electrode 6. A first lead 8 may be electrically coupled to the control electrode 2, and a second lead 12 may be electrically coupled to the first load electrode 4. In addition, a third lead 14 may be electrically coupled to a further electrode 30 of the compound semiconductor chip 10, and a fourth lead 16 may be electrically connected to the second load electrode 6. The third lead 14 may be configured to provide a sensing signal SS from the further electrode 30, wherein the sensing signal SS may be based on at least one of an electrical potential of the compound semiconductor chip 10, an electrical current of the compound semiconductor chip 10, and a temperature of the compound semiconductor chip 10.

For example, the compound semiconductor chip 10 may be a power HEMT, wherein the control electrode 2, the first load electrode 4 and the second load electrode 6 may correspond to a gate electrode, a source electrode and a drain electrode. The further electrode 30 may coincide with one of these electrodes in one example, and may represent an individual electrode in another example. In one more specific example, the further electrode 30 may coincide with or may correspond to the source electrode of the power HEMT and may provide a sensing signal representing an electrical potential $U_S$ of the source electrode that may be used as previously described. In a further example, the further electrode 30 may be an electrode separated from the three other electrodes and may provide a sensing signal representing an electrical current or a temperature of the semiconductor chip 10.

Figure 4A:
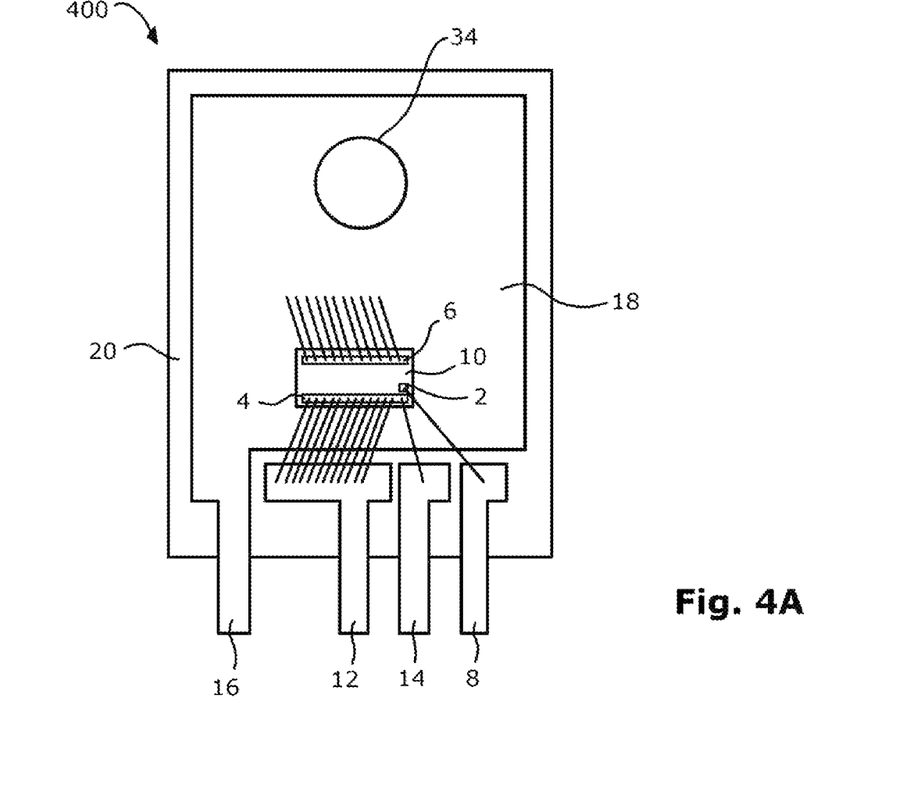
FIG. 4A schematically illustrates a top view of a device 400 in accordance with the disclosure.
Figure 4B:
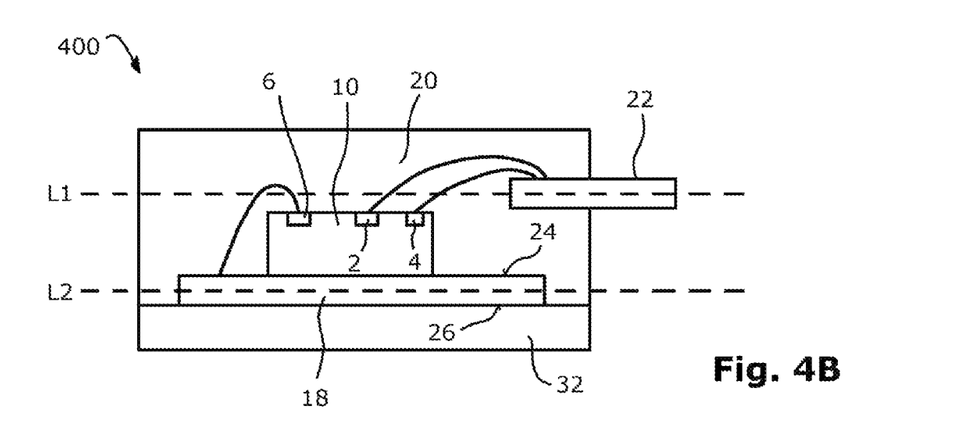
FIG. 4B schematically illustrates a cross-sectional side view of the device 400.

FIGS. 4A and 4B schematically illustrate views of a device 400 in accordance with the disclosure. In particular, FIG. 4A illustrates a top view of the device 400, and FIG. 4B illustrates a cross-sectional side view of the device 400. Due to the chosen perspectives, FIG. 4A may show components that are not shown by FIG. 4B and vice versa. The device 400 may be seen as a more detailed implementation of the devices 100 to 300 such that details of the device 400 described below may be likewise applied to the devices 100 to 300.

The device 400 may include a compound semiconductor chip 10 that may be mounted over a diepad 18 of a leadframe. The compound semiconductor chip 10 may include a gate electrode 2, a source electrode 4 and a drain electrode 6. The device 400 may further include multiple leads 8, 12, 14, 16 that may be a part of the leadframe as well. In FIG. 4B, not all of the leads 8, 12, 14, 16 may be visible due to the chosen perspective. Here, the plurality of leads 8, 12, 14, 16 is denoted by a single reference sign 22. The device 400 may further include an encapsulation material 20 and a heatsink 32. The heatsink 32 may be regarded as a part of the device 400 or not.

The compound semiconductor chip 10 may be based on a compound semiconductor material, for example gallium nitride. In the example of FIGS. 4A and 4B, the compound semiconductor chip 10 may correspond to a power HEMT chip, wherein the gate electrode 2, the source electrode 4 and the drain electrode 6 may be arranged over a main surface of the compound semiconductor chip 10 facing away from the diepad 18. Hence, the compound semiconductor chip 10 may have a lateral structure.

The gate electrode 2 may be electrically connected to the first lead 8, the source electrode 4 may be electrically connected to the second lead 12 and the third lead 14, and the drain electrode 6 may be electrically connected to the fourth lead 16 and the diepad 18. The plurality of leads 22 may at least partly protrude out of the encapsulation material 20 such that electrical connections between the electrodes of the compound semiconductor chip 10 and one or more components arranged outside of the encapsulation material 20 may be established. Since the drain electrode 6 may be electrically connected to the diepad 18 arranged on the bottom side of the compound semiconductor chip 10, the illustrated arrangement may be referred to as drain down arrangement.

The leads and the electrodes of the compound semiconductor chip 10 may be electrically coupled via electrically conductive elements of the device 400 as illustrated in FIGS. 4A and 4B. The electrically conductive elements may correspond to wires and/or clips. In the example of FIGS. 4A and 4B, the electrically conductive elements are illustrated by solid lines. A respective electrical connection between a lead and an electrode may be established by one or more wires in one example. Here, the number of used wires may depend on the strength of the currents that may pass between the considered lead and electrode during an operation of the device 400. In addition, a thickness of a first electrically conductive element electrically coupling an electrode to a lead may differ from a thickness of a second electrically conductive element electrically coupling the electrode to a different lead. For example, a thickness of a wire electrically coupling the source electrode 4 to the second lead 12 may differ from a thickness of a wire electrically coupling the source electrode 4 to the third lead 14.

As can be seen from FIG. 4B, the plurality of leads 22 may be arranged on a first level L1 while the diepad 18 may be arranged on a second level L2 that may differ from the first level L1. An exemplary distance between the first level L1 and the second level L2 may lie in a range from about 0.5 millimeter to about 5.0 millimeter. In a further example, the diepad 18 and at least one of the leads 8, 12, 14, 16 may be arranged on a same level. In one example, the diepad 18 and the plurality of leads 22 may be part of the same leadframe. In this case, the diepad 18 and the plurality of leads 22 may have been formed before or after bending the leadframe in a suitable manner to provide the illustrated levels L1 and L2. The level L1 including the plurality of leads 22 may be referred to as wirebond level, and the level L2 including the diepad 18 may be referred to as diepad level.

The diepad 18 may be at least partly embedded in the encapsulation material 20. In the example of FIGS. 4A and 4B, the diepad 18 may be exposed from the encapsulation material 20 on its lower surface. In particular, the exposed lower surface of the diepad 18 and the lower surface of the encapsulation material 20 may be flush, i.e. the surfaces may be arranged in a common plane. Due to the flush arrangement of the surfaces, the lower surface of the diepad 18 may contact the heatsink 32, in particular in a common plane. In one example, the diepad 18 may be in direct contact with the heatsink 32. In a further example, additional layers, such as e.g. thermal grease, may be arranged between the diepad 18 and the heatsink 32. A heat dissipation path may extend from the compound semiconductor chip 10 arranged over the diepad 18 to the heatsink 32 in a direction substantially perpendicular to a mounting surface of the diepad 18.

The diepad 18 may include an enlarged surface for mounting one or more electronic components, for example the compound semiconductor chip 10. In addition, the diepad 18 may include an elongated section that may form the fourth lead 16. In this regard, the fourth lead 16 and the diepad 18 may e.g. be formed contiguous as a single piece that may be made of an electrically conductive material. The fourth lead 16 may protrude out of the encapsulation material 20 such that an electrical coupling between the drain electrode 6 and an external component arranged outside of the encapsulation material 20 may be established.

In FIG. 4B, the vertical side surfaces of the diepad 18 may be covered by the encapsulation material 20. In a further example, a part of the diepad 18 may protrude out of the encapsulation material 20 on one of its sides such that at least one of the side surfaces of the diepad 18 may remain uncovered by the encapsulation material 20. The diepad 18 may include a hole 34 that may extend through the diepad 18 between one main surface 24 of the diepad 18 and another main surface 26 of the diepad 18. In the example of FIGS. 4A and 4B, the hole 34 may additionally protrude through the encapsulation material 20. In a further example, the part of the diepad 18 including the hole 34 may be exposed from the encapsulation material 20. The heatsink 32 may be attached to the diepad 18 by a fixing component, for example a screw, that may extend through the hole 34.

One or more of the leads 22 may include an increased surface area on a respective end section that may be covered by the encapsulation material 20, wherein the increased surface area may be used for wirebonding purposes. In particular, the plurality of leads 22 may protrude out of a same surface of the encapsulation material 20. The chosen arrangement of the leads 22 may result in different lead pitches of the device 400. For example, a distance between the fourth lead 16 and the lead directly neighboring the fourth lead 16 may be greater than each of the distances between two directly neighboring leads of the three further leads 8, 12 and 14. In the example of FIGS. 4A and 4B, the lead directly neighboring the fourth lead 16 may correspond to the second lead 12. The leads 22 may be arranged in parallel such that the device 400 may e.g. be arranged over a printed circuit board (PCB) as exemplarily illustrated in FIG. 6.

The third lead 14 may be configured to provide a sensing signal, wherein the sensing signal may be based on a physical parameter of the compound semiconductor chip 10.

Examples for possible sensing signals have been discussed in foregoing paragraphs. For example, the sensing signal may represent at least one of an electrical potential, an electrical current, a temperature, etc. of the device 400, and in particular of the compound semiconductor chip 10. In the example of FIGS. 4A and 4B, the sensing signal may be provided from the source electrode 4 of the compound semiconductor chip 10. In further examples, the sensing signal may also be provided from a different electrode of the compound semiconductor chip 10.

Figure 7:
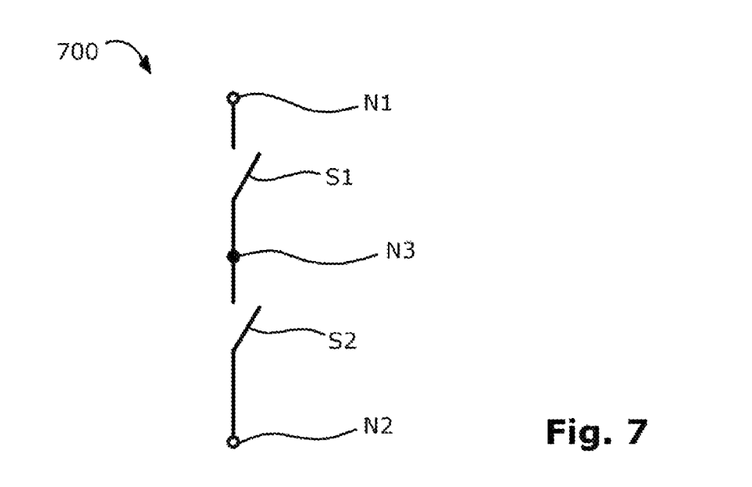
FIG. 7 illustrates a schematic diagram of a half bridge circuit 700.

In one example, the compound semiconductor chip 10 may correspond to a power HEMT that may form a part of a switch of a half bridge circuit as described with regard to FIG. 7. In this connection, the power HEMT 10 may be controlled by a gate driver (not illustrated) which may be a part of the device 400 or may be included in a separate semiconductor package. Furthermore, the device 400 may include additional electronic components that are not illustrated for the sake of simplicity. In one example, the device 400 may include an additional compound power HEMT and an additional gate driver which may form a second switch of the half bridge circuit. In particular, additional components may also be at least partly covered by the encapsulation material 20 and thus be a part of the same semiconductor package.

Figure 5A:
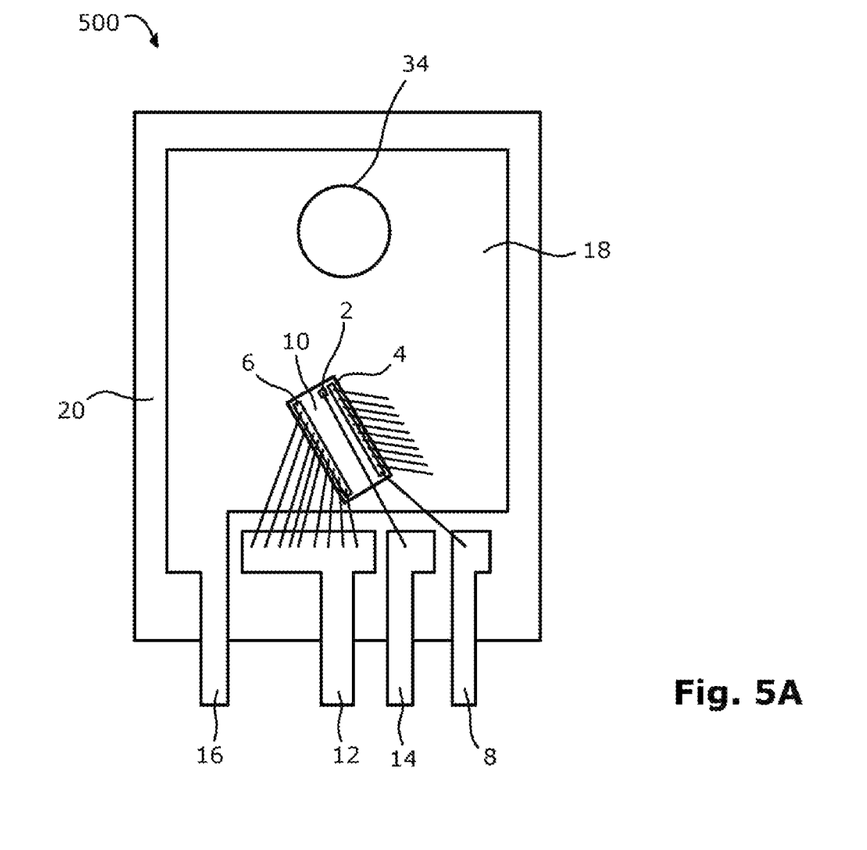
FIG. 5A schematically illustrates a top view of a device 500 in accordance with the disclosure.
Figure 5B:
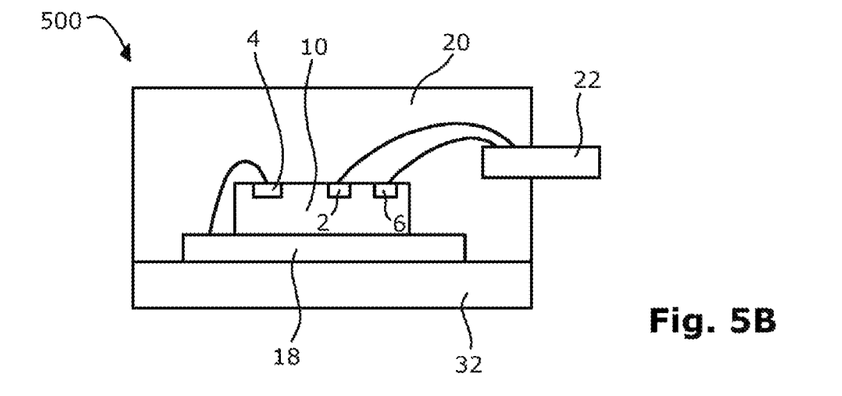
FIG. 5B schematically illustrates a cross-sectional side view of the device 500.

FIGS. 5A and 5B schematically illustrate views of a device 500 in accordance with the disclosure. In particular, FIG. 5A illustrates a top view of the device 500, and FIG. 5B illustrates a cross-sectional side view of the device 500. Due to the chosen perspectives, FIG. 5A may show components that are not shown by FIG. 5B and vice versa. The device 500 may be seen as a more detailed implementation of the devices 100 to 300 such that details of the device 500 may be likewise applied to the devices 100 to 300. In addition, the device 500 may be at least partly similar to the device 400.

The devices 400 and 500 may represent a similar circuitry. Similar to the device 400, the compound semiconductor chip 10 of the device 500 may correspond to a power HEMT chip including a gate electrode 2, a source electrode 4 and a drain electrode 6 that may be arranged over a main surface of the compound semiconductor chip 10 facing away from the diepad 18. The compound semiconductor chip 10 may thus have a lateral structure. However, in FIGS. 5A and 5B, the electrical connections between the electrodes 2, 4, 6 of the compound semiconductor chip 10 and the leads 8, 12, 14, 16 protruding out of the encapsulation material 20 may differ from corresponding electrical connections of the device 400. In the example of FIGS. 5A and 5B, using a similar numbering of the leads as in FIGS. 4A and 4B, the gate electrode 2 may be electrically connected to the third lead 14, the source electrode 4 may be electrically connected to the first lead 8, the fourth lead 16 and the diepad 18, and the drain electrode 6 may be electrically connected to the second lead 12. Since the source electrode 4 may be electrically connected to the diepad 18 arranged on the bottom side of the compound semiconductor chip 10, the illustrated arrangement may be referred to as source down arrangement. The first lead 8 connected to the source electrode 4 may be configured to provide one or more of the sensing signals previously discussed from the source electrode 4.

Figure 6:
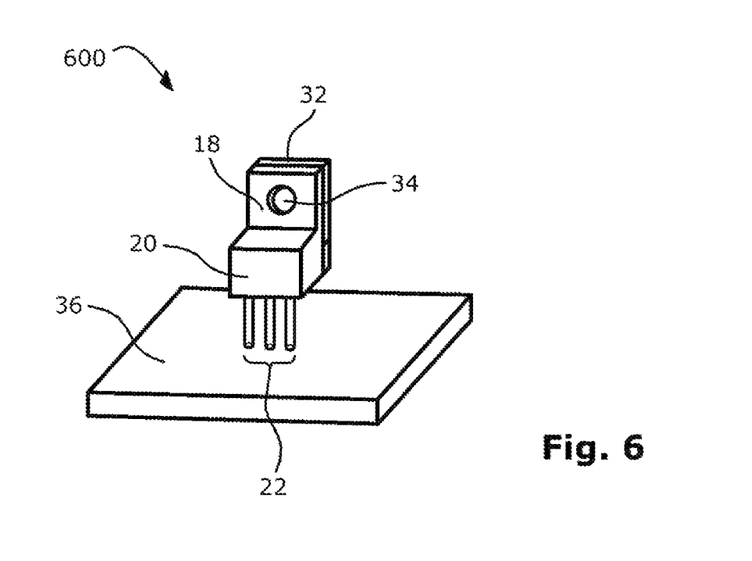
FIG. 6 schematically illustrates a system including a device 600 in accordance with the disclosure.

FIG. 6 schematically illustrates a perspective view of a system including a device 600 in accordance with the disclosure. For example, the device 600 may at least partly be similar to one of the previously described devices in accordance with the disclosure. The device 600 may include a semiconductor package that may include one or more electronic components, for example a compound semiconductor chip as previously described. In FIG. 6, the electronic components of the device 600 may be covered by an encapsulation material 20 and may thus be not visible.

The electronic components may be arranged over a carrier that may correspond to a leadframe including one or more diepads and a plurality of leads. The carrier may at least partly be covered by the encapsulation material 20. In the example of FIG. 6, a part of a diepad 18 of the carrier may protrude out of the encapsulation material 20. The protruding part of the diepad 18 may include a hole 34 that may extend through the diepad 18. In a further example, the part of the diepad 18 including the hole 34 may be covered by the encapsulation material 20 as well, wherein the hole 34 may then additionally extend through the encapsulation material 20. A heatsink 32 may be attached to the rear surface of the semiconductor package, in particular to an exposed surface of the diepad 18, for example by means of a screw (not illustrated). The heatsink 32 may be seen as a part of the device 600 or not.

A plurality of leads 22 may protrude out of the encapsulation material 20. The plurality of leads 22 may be configured to provide an electrical connection to components of the device 600 arranged inside the encapsulation material 20. The semiconductor package may be mounted on a printed circuit board (PCB) 36. The PCB 36 may be regarded as a part of the device 600 or not. The PCB 36 may provide an electrical connection between the device 600 and further electronic components that may also be mounted on the PCB 36. The number and types of the further electronic components may depend on the desired operation of the system. For example, a further semiconductor package including a control semiconductor chip for driving a possible compound semiconductor chip of the device 600 may be mounted on the PCB 36. Furthermore, a semiconductor package including a voltage measuring unit for measuring a voltage based on a sensing signal provided by a sensing lead of the compound semiconductor chip may be mounted on the PCB 36.

FIG. 7 illustrates a schematic diagram of a half bridge circuit 700. The half bridge circuit 700 may be arranged between nodes N1 and N2. The half bridge circuit 700 may include switches S1 and S2 connected in series. Constant electrical potentials may be applied to the nodes N1 and N2. For example, a high potential, such as 10, 12, 18, 50, 110, 230, 500 or 1000 V or any other potential, may be applied to the node N1 and a low electrical potential, for example 0 V, may be applied to the node N2. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit 700 may e.g. be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

The devices in accordance with the disclosure may be configured to operate as a half bridge circuit or at least a part of it. For example, the devices 400 and 500 of FIGS. 4 and 5 may be configured to operate as a switch of a half bridge circuit. In a similar fashion, a device in accordance with the disclosure may be configured to operate as at least a part of any other bridge circuit or a cascode circuit.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof.

What is claimed is:

1. A device, comprising:
   a compound semiconductor chip comprising a power HEMT (High Electron Mobility Transistor), a control electrode of the power HEMT, a first load electrode of the power HEMT and a second load electrode of the power HEMT;
   a first lead electrically coupled to the control electrode;
   a second lead electrically coupled to the first load electrode;
   a third lead electrically coupled to the first load electrode, wherein the third lead is configured to provide a sensing signal that indicates an electrical potential of the first load electrode, and wherein the control electrode is configured to receive a control signal based on a voltage that does not take into account the sensing signal and a corrected voltage which takes into account the sensing signal; and
   a fourth lead electrically coupled to the second load electrode.

2. The device of claim 1, wherein the third lead is configured to provide the sensing signal to a control semiconductor chip.

3. The device of claim 2, wherein the control semiconductor chip is configured to provide the control signal to the control electrode.

4. The device of claim 2, wherein the control semiconductor chip comprises a gate driver circuit configured to drive the control electrode of the power HEMT based on the sensing signal.

5. The device of claim 2, wherein the compound semiconductor chip is covered by a first encapsulation material, and wherein the control semiconductor chip is covered by a second encapsulation material separated from the first encapsulation material.

6. The device of claim 1, wherein the third lead is configured to be electrically coupled to a voltage measuring unit configured to measure the electrical potential of the first load electrode.

7. The device of claim 1, wherein the third lead is electrically coupled to an electronic component integrated in the compound semiconductor chip, and wherein the integrated electronic component comprises at least one of a shunt and a diode.

8. The device of claim 1, wherein a distance between the fourth lead and a lead directly neighboring the fourth lead is greater than each of the distances between directly neighboring leads of the first lead, the second lead and the third lead.

9. The device of claim 1, wherein a first electrically conductive element electrically couples the second lead to the first load electrode, wherein a second electrically conductive element electrically couples the third lead to the first load electrode, and wherein a thickness of the first electrically conductive element differs from a thickness of the second electrically conductive element.

10. The device of claim 1, further comprising:
    a carrier, wherein the compound semiconductor chip is arranged over a first surface of the carrier; and
    an encapsulation material covering the compound semiconductor chip and the carrier, wherein a second surface of the carrier opposite the first surface is exposed from the encapsulation material.

11. The device of claim 10, wherein a surface of the encapsulation material and the second surface of the carrier are flush.

12. The device of claim 10, wherein each lead protrudes out of a same surface of the encapsulation material, and wherein the surface is perpendicular to at least one of the first surface and the second surface of the carrier.

13. The device of claim 10, wherein the second surface of the carrier is configured to be coupled to a heatsink, and wherein the leads extend parallel to each other in a direction perpendicular to a heat dissipation path extending from the compound semiconductor chip to the heatsink.

14. The device of claim 10, wherein the carrier and at least one of the leads are arranged on different levels, and wherein a distance between the different levels lies in a range from 0.5 millimeters to 5.0 millimeters.

15. The device of claim 10, wherein the carrier comprises a hole extending through the carrier.

16. The device of claim 10, wherein the carrier and the leads are part of a same leadframe.

17. The device of claim 1, wherein the compound semiconductor chip comprises a power semiconductor comprising gallium nitride.

18. A device, comprising:
    a compound semiconductor chip comprising a power HEMT (High Electron Mobility Transistor), a control electrode of the power HEMT, a first load electrode of the power HEMT and a second load electrode of the power HEMT;
    a first lead electrically coupled to the control electrode;
    a second lead electrically coupled to the first load electrode;
    a third lead electrically coupled to the first load electrode, wherein the third lead is configured to provide a sensing signal that indicates an electrical current in the compound semiconductor chip, and wherein the control electrode is configured to receive a control signal that accounts for the electrical current in the compound semiconductor chip as indicated by the sensing signal so that an operation of one or more components of the device are adjusted responsive to the control signal to force the electrical current below a threshold value; and a fourth lead electrically coupled to the second load electrode.

19. A device, comprising:

a compound semiconductor chip comprising a power HEMT (High Electron Mobility Transistor), a control electrode of the power HEMT, a first load electrode of the power HEMT and a second load electrode of the power HEMT;

a first lead electrically coupled to the control electrode;

a second lead electrically coupled to the first load electrode;

a third lead electrically coupled to the first load electrode, wherein the third lead is configured to provide a sensing signal that indicates a temperature of the compound semiconductor chip, and wherein the control electrode is configured to receive a control signal that accounts for the temperature of the compound semiconductor chip as indicated by the sensing signal so that an operation of one or more components of the device are adjusted responsive to the control signal to force the temperature below a threshold value; and a fourth lead electrically coupled to the second load electrode.

* * * * *